US008669570B2

(12) United States Patent
Hochstein

(10) Patent No.: US 8,669,570 B2
(45) Date of Patent: Mar. 11, 2014

(54) INDIVIDUAL LIGHT SHIELDS

(75) Inventor: Peter A. Hochstein, Troy, MI (US)

(73) Assignee: Relume Technologies, Inc., Oxford, MI (US)

( * ) Notice: Subject to any disclaimer, the term of this patent is extended or adjusted under 35 U.S.C. 154(b) by 378 days.

(21) Appl. No.: 13/057,531

(22) PCT Filed: Jan. 20, 2009

(86) PCT No.: PCT/US2009/031417
§ 371 (c)(1), (2), (4) Date: Feb. 4, 2011

(87) PCT Pub. No.: WO2010/016950
PCT Pub. Date: Feb. 11, 2010

(65) Prior Publication Data

US 2011/0140140 A1 Jun. 16, 2011

Related U.S. Application Data

(60) Provisional application No. 61/086,837, filed on Aug. 7, 2008.

(51) Int. Cl.
*H01L 29/205* (2006.01)
*H01L 33/00* (2010.01)

(52) U.S. Cl.
USPC .................... 257/91; 257/E33.072; 362/235

(58) Field of Classification Search
USPC .................................................. 257/91
See application file for complete search history.

(56) References Cited

U.S. PATENT DOCUMENTS

| | | | | |
|---|---|---|---|---|
| 5,857,767 | A | 1/1999 | Hochstein | |
| 6,517,218 | B2 * | 2/2003 | Hochstein | 362/294 |
| 7,080,924 | B2 | 7/2006 | Tseng et al. | |
| 7,244,050 | B2 | 7/2007 | Summerford et al. | |
| 2003/0035299 | A1 | 2/2003 | Amano | |
| 2003/0202349 | A1 * | 10/2003 | Suehiro et al. | 362/245 |
| 2008/0042544 | A1 * | 2/2008 | Park et al. | 313/483 |
| 2008/0197773 | A1 * | 8/2008 | Cha et al. | 313/582 |
| 2009/0257215 | A1 * | 10/2009 | Gomi | 362/97.1 |

FOREIGN PATENT DOCUMENTS

| | | |
|---|---|---|
| KR | 200437850 | 1/2008 |
| WO | 2008013072 | 1/2008 |

* cited by examiner

*Primary Examiner* — Matthew Landau
*Assistant Examiner* — Igwe U Anya
(74) *Attorney, Agent, or Firm* — Dickinson Wright, PLLC

(57) ABSTRACT

A light emitting assembly (10) includes a plurality of light emitting diodes (28) (L.E.D.s) serially aligned along a mounting surface (14) and a light shield (40) is disposed adjacent each L.E.D. An exterior surface of one light shield (40) is exposed to light emitting from an adjacent light shield (40). A non-reflective film (52) comprising a black color is painted over the exterior surface and a reflective material (54) is disposed over an interior surface of each light shield (40). The light shields (40) comprise sections (44) defined by a triangular shape joining at a ridge (48) and extending upwardly from the mounting surface (14) at an angle to define an opening for emitting light. The light shields (40) are spaced from the L.E.D.s at desired locations and angles to achieve full cutoff light emissions.

18 Claims, 4 Drawing Sheets

INDIVIDUAL LIGHT SHIELDS

CROSS-REFERENCE TO RELATED APPLICATIONS

This application is a National Stage of International Application No. PCT/US2009/031417, filed Jan. 20, 2009. This application claims the benefit of U.S. Provisional Application No. 61/086,837, filed on Aug. 7, 2008. The entire disclosure of the above application is incorporated herein by reference.

BACKGROUND OF THE INVENTION

1. Field of the Invention

The subject invention relates to a light emitting assembly of the type including light emitting diodes (L.E.D.s), and more particularly, efficient and full cutoff of light emissions.

2. Description of the Prior Art

Municipal or street light assemblies often generate spurious or scattered light emissions, which wastes usable energy. The scattered light also creates haze in the atmosphere, which obscures celestial objects and interferes with astronomical observations. Increased awareness of light pollution has created a demand for light assemblies achieving "full cutoff" or the "dark skies compliant" in the municipal and commercial lighting fields. Light assemblies meeting this criteria restrict or eliminate all light emissions above the horizon to reduce interference with astronomical observations. Full cutoff light assemblies also improve drivers' visual acuity by increasing contrast and reducing glare. In other words, light emitted by the light assemblies is directed onto the street rather than into drivers' eyes.

The U.S. Illumination Engineering Society has developed specifications for such a "full cutoff" designation. To meet the specification, the amount of light above eighty-five (85) degrees, i.e. upward light, emitting from the light assembly must be less than 1.5% of the total light flux of the light assembly, measured in lumens. Such a rigorous specification is difficult to achieve with conventional high intensity discharge (HID) single point light sources such as mercury, metal halide, or high pressure sodium lamps, due to geometric limitations. Specifically, the requirements for wide, non-scattered and uniform illumination, and the need to cut off light 5 degrees below the horizon, are difficult to reconcile in practical light assemblies, which typically include prismatic lenses that scatter light, unless the prismatic lenses are replaced with a relatively sophisticated reflector and aperture. An example of such an assembly is disclosed in the U.S. Pat. No. 7,244,050 Summerford et. al. The Summerford '050 patent discloses an HID light assembly including two sophisticated reflectors within a single light shield for achieving full cutoff.

In addition to achieving efficient and full cutoff light emissions, municipalities and commercial entities desire to replace HID street lamps with properly designed L.E.D. light assemblies. An example of such an assembly is disclosed in the U.S. Pat. No. 5,857,767 to the present inventor, Peter A. Hochstein, which is directed to effective thermal management. The Hochstein '767 patent discloses a light assembly including plurality of light emitting diodes disposed on a heat sink including a plurality of fins designed to enhance convective cooling. Proven metrics indicate that at least a fifty percent (50%) energy savings is possible due to the far greater service life that L.E.D. light assemblies offer.

At this time, and in the foreseeable future, L.E.D. light assemblies that are suitable replacements for conventional HID light sources, such as the assembly disclosed in the Hochstein '767 patent, contain a large number of L.E.D.s. These light assemblies are driven in series and/or parallel circuits to optimize their efficiency and generally occupy a much larger light emitting area than the HID light assemblies they replace. For example, while a 400 Watt HID light assembly might occupy an effective radiating area of a few square centimeters, an equivalent L.E.D. light assembly would present a source of several hundred square centimeters.

Obviously, such a distributed source is much more difficult to model optically, and to date it has not lent itself to effective, sharp cutoff beam shaping. With such relatively large and distributed source L.E.D. light assemblies, the simple expedient of using a single perimeter light shield to block high angle light, like those used for HID lamps, will not work. Each L.E.D. light source represents a unique geometry to the light shield. If a single light shield is used for a large number of L.E.D.s, light emitting from the L.E.D.s is scattered in undesired directions. If the entire light assembly is canted with respect to the horizon, the single light shield will be even more ineffective in controlling undesired scattered light. However, such canting or angular aiming of the entire light assembly is often required in order to properly cover the roadway surface with even illumination.

There remains a great need for an L.E.D. light assembly which achieves the full cutoff designation and prevents undesired scattered light to improve energy efficiency.

SUMMARY OF THE INVENTION

The subject invention provides for such a light assembly including a plurality of light emitting diodes disposed on a mounting surface. A light shield supported by the mounting surface is disposed over each of the light emitting diodes for directing light emitting from the light emitting diodes in a desired predetermined direction. The light shields are serially aligned along the mounting surface in the predetermined direction with an exterior surface of one light shield being exposed to light emitting from an adjacent light shield. The exterior surface of the light shields exposed to light emitting from the adjacent light shield is non-reflective for absorbing light emitting from the adjacent light shield.

ADVANTAGES OF THE INVENTION

The present invention allows L.E.D. light assemblies of any size to easily meet the U.S. Illumination Engineering Society's specifications for full cutoff designation. From an optical design standpoint, each L.E.D. source is considered as a single point source of light which may be optimally shielded by an individual light shield. The sharpness of the cutoff that can be achieved with the multiple light shield geometry is exemplary.

Further, the exterior surfaces of each light shield are painted flat black to absorb light emitting from an adjacent light shield. This prevents the undesired scattering of light which typically occurs when multiple light shields are disposed in close proximity. The interior surface of each light shield preferably comprises a reflective material, so light that might otherwise be lost to the light shield is redirected in the desired direction, such as a roadway surface. Proven metrics indicate that up to 20% more useful light is available with the arrangement of the subject invention.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
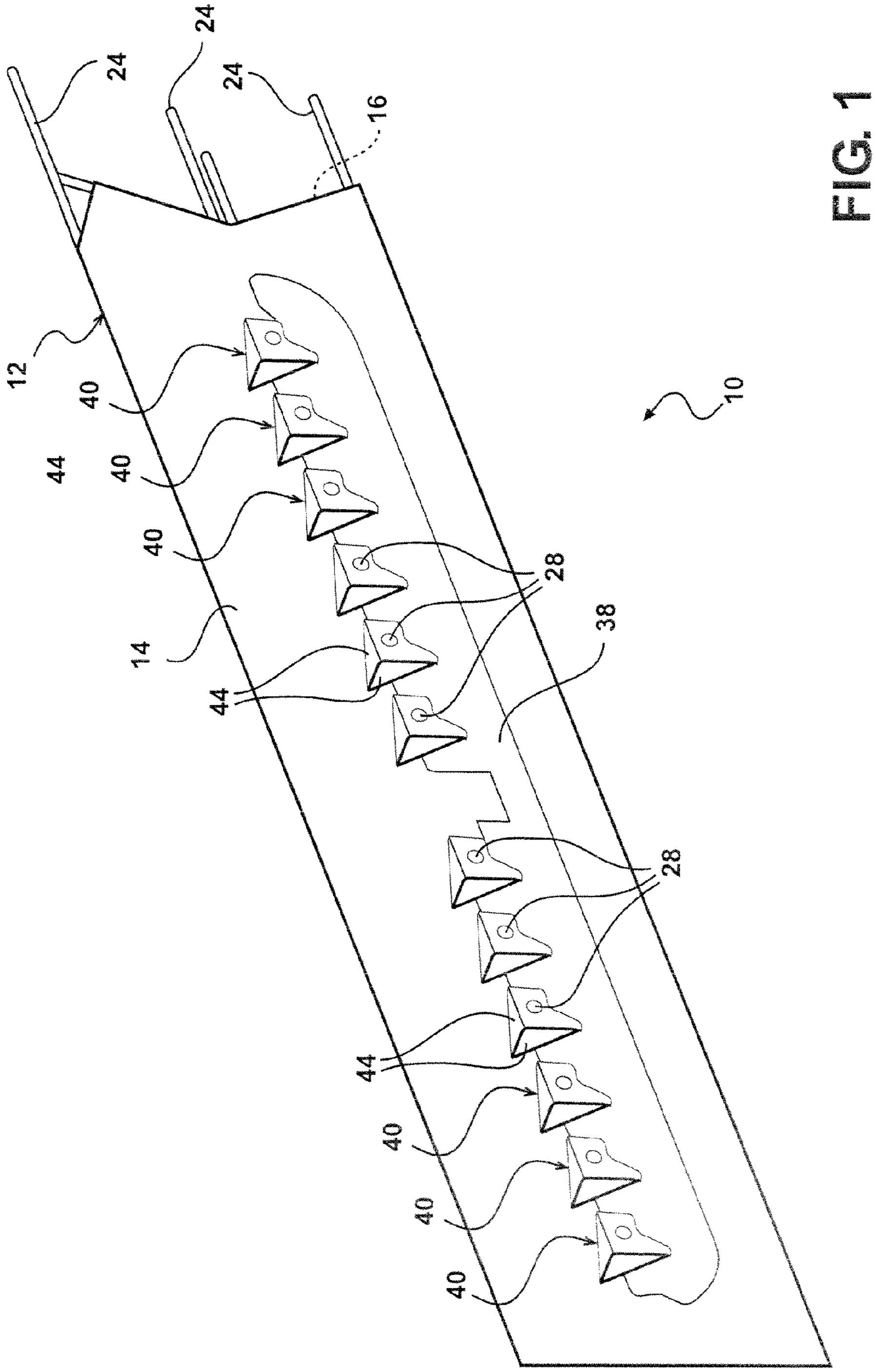
FIG. 1 is perspective view of a preferred embodiment of the subject invention wherein the individual light shields comprise a triangular shape.
Figure 2:
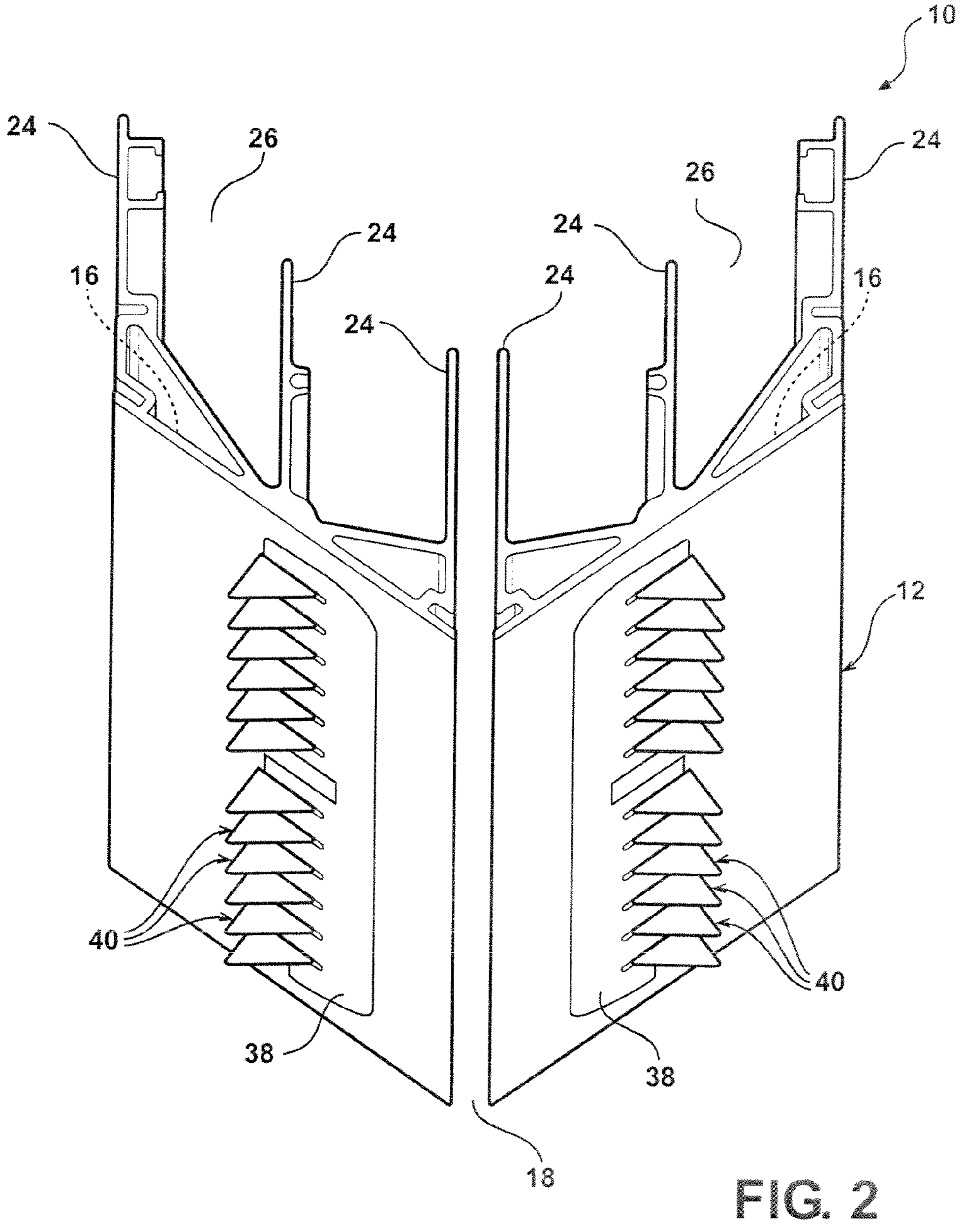
FIG. 2 is a perspective view of a preferred embodiment of the subject invention wherein the mounting surface has an angle other than ninety degrees relative to the parallel fins.

Referring to the Figures, alight emitting assembly 10 is generally shown. The light assembly 10 preferably comprises a heat sink 12 of thermally conductive material presenting a mounting surface 14 and a heat transfer surface 16 facing in the opposite direction from the mounting surface 14, as shown in FIGS. 1 and 2. The heat sink 12 is typically made of metal, such as a homogeneous aluminum or an aluminum alloy.

The heat sink 12 may be defined by an elongated strip, as shown in FIGS. 1 and 2. As shown in FIG. 2, a plurality of the elongated strips are disposed in spaced and parallel relationship to one another to present side edges defining an elongated slot 18 therebetween extending continuously alone adjacent side edges of the elongated strips to separate and render adjacent elongated strips independent of one another. The elongated slots 18 enhance the convective cooling of the assembly 10 by allowing ambient air to pass by each of the elongated strips.

Figure 3:
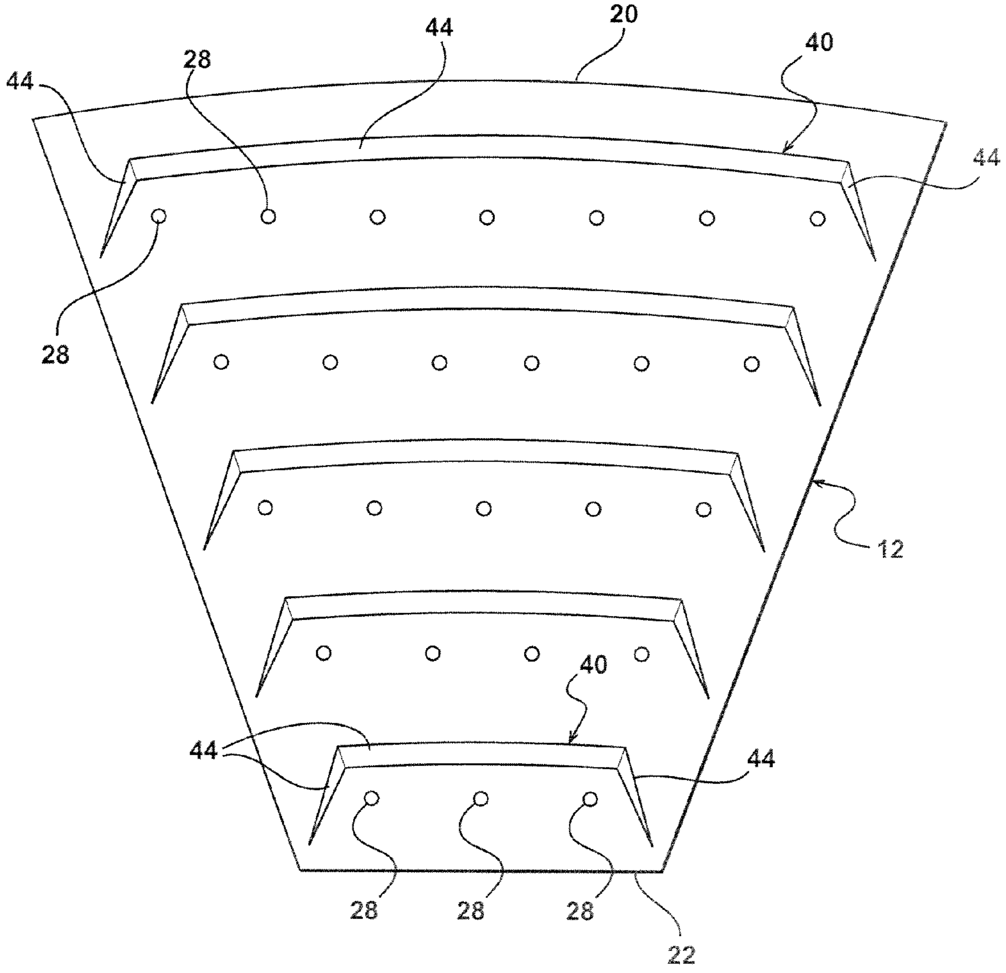
FIG. 3 is a plan (frontal) view of a second embodiment of the subject invention wherein each light shield is disposed along and parallel to a row of the light emitting diodes.

In an alternative embodiment, the heat sink 12 may comprise a generally triangular shape extending from a wide top end 20 to a narrow bottom end 22, as shown in FIG. 3. The heat sink 12 comprising a generally triangular shape is typically disposed in a globe lamp defined by a spherical shape, which naturally has a diameter being larger in a middle area and tapering towards a bottom area of the lamp. Four of the heat sinks 12 comprising a generally triangular shape can be disposed in a bottom hemisphere of the globe lamp and tipped downwards at an angle of approximately thirty (30) degrees, so that the wide top ends 20 of the heat sinks 12 efficiently fill the larger middle area and the narrow bottom ends 22 efficiently fill the smaller bottom area of the lamp. Alternatively, the heat sinks 12 comprising a generally triangular shape can be disposed in a lantern defined by a square shape, which has a width being larger at a top area and tapering towards a bottom area of the lantern. The wide top ends 20 of the heat sinks 12 efficiently fill the larger top area and the narrow bottom ends 22 efficiently fill the smaller bottom area of the lantern.

The heat sink 12 includes a plurality of fins 24 extending transversely from the heat transfer surface 16 and disposed in spaced and parallel relationship to one another for transferring heat away from the heat sink 12 to surrounding ambient air, as shown in FIGS. 1 and 2. In the embodiment wherein the heat sink 12 comprises the plurality elongated strips, the fins 24 extend continuously between ends of each of the elongated strips to present a void space 26 between adjacent fins 24 and open at the ends for exposing the void space 26 between the adjacent fins 24 to air. The heat transfer surface 16 of the elongated strips may be disposed perpendicular to the parallel fins 24 thereof, or at an angle other than ninety degrees relative to the parallel fins 24 thereof, as shown in FIGS. 1 and 2. In the embodiment wherein the heat sink 12 comprises the generally triangular shape, the fins 24 may extend continuously between the wide top end 20 and narrow bottom end 22.

The light emitting assembly 10 includes a plurality of light emitting diodes 28 disposed on the mounting surface 14. The light emitting diodes 28 on the mounting surface 14 of the heat sink 12 are serially aligned in a row, as shown in FIG. 1, or in a plurality of rows spaced and parallel to one another, as shown in FIG. 3, and electrically interconnected in series with one another. In the embodiment wherein the heat sink 12 comprises the plurality of elongated strips, the light emitting diodes 28 on the mounting surface 14 of each elongated strip are typically electrically interconnected in parallel with the light emitting diodes 28 on the other elongated strips, but the elongated strips may be electrically interconnected in series with the light emitting diodes 28 on the other elongated strips if a high voltage power supply is used. In the embodiment wherein the heat sink 12 comprises a generally triangular shape, the light emitting diodes 28 are aligned in rows decreasing in length from the wide top end 20 to the narrow bottom end 22 of the heat sink 12.

Figure 5:
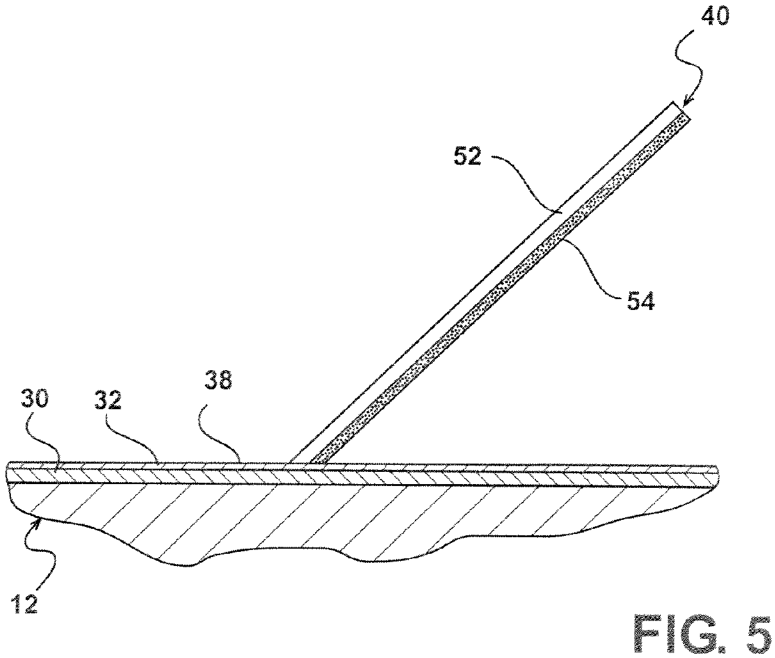
FIG. 5 is a fragmentary cross sectional view taken along line 5-5 of FIG. 4.

The light assembly 10 preferably includes an insulation coating 30 of electrically insulating material disposed over the mounting surface 14 of each heat sink 12, as shown in FIG. 5. The insulation coating 30 is less than one thousand microns thick, but preferably about 50 microns thick. The insulation coating 30 may be continuous and cover the entire mounting surface 14, or it may be disposed in circuitous tracks separated from one another by the bare mounting surface 14.

Figure 4:
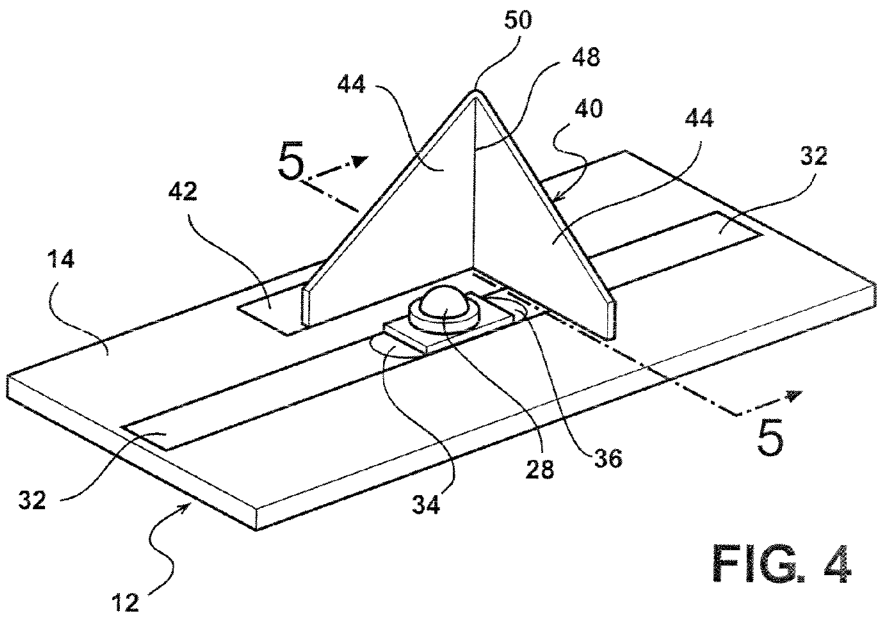
FIG. 4 is a fragmentary perspective view of a preferred embodiment of the subject invention showing one light emitting diode and the accompanying individual light shield comprising a triangular shape.

A plurality of circuit traces 32 are spaced from one another and disposed on the insulation coating 30 of the mounting surface 14 for preventing electrical conduction between the traces 32 and from each of the traces 32 to the mounting surface 14. Each light emitting diode 28 spans the space between the ends of adjacent traces 32, as shown in FIG. 4. Each light emitting diode 28 has a positive lead 34 and a negative lead 36, as shown in FIG. 4, being in electrical engagement with the adjacent ones of the traces 32 to electrically interconnect the traces 32 and the light emitting diodes 28. An electrically conductive adhesive secures the leads 34, 36 to the circuit traces 32. The electrical components of the light assembly 10 are typically connected with printed, foil or wire conductors, and the conductor feed-throughs should be sealed when the assembly 10 is used outdoors.

The light assembly 10 typically includes a protective and conformal coating 38 of electrically insulating material disposed over the mounting surface 14, as shown in FIGS. 1, 2 and 5, to protect the them from physical damage, moisture, and other environmental elements. The conformal coating 38 may be disposed over the light emitting diodes 28 and corresponding electrical components, including the circuit traces 32, light emitting diodes 28 and leads 34, 36, or any number of these components. The conformal coating 38 is typically a very durable two component, chemically catalyzed, urethane. The conformal coating 38 is preferably a translucent material and about 50 microns in thickness.

A light shield 40, generally indicated, is disposed on the mounting surface 14 adjacent each light emitting diode 28. The light shields 40 are typically disposed on the mounting surface 14 after the conformal coating 38 is applied, so that the conformal coating 38 prevents the light shields 40 from electrically shorting the light emitting diodes 28 and accompanying electrical components. The light shields 40 may be disposed over the mounting surface 14 of the heat sink 12 with a light shield adhesive 42 comprising an ultraviolet cured cyanoacrylate material or a 3M adhesive tape, as shown in FIG. 4.

The light shields 40 typically comprise a thermally stable opaque material. The light shields 40 are defined by sections 44 extending upwardly at a predetermined angle from the mounting surface 14 over at least one of the light emitting diodes 28 to a forward edge 46 defining a forward facing opening for directing the light out of the forward facing opening in a predetermined direction. For example, the light shields 40 can extend at the predetermined angle to direct light five degrees below the horizon and towards a roadway, to achieve the full cutoff designation. The sections 44 connect at a ridge 48 extending upwardly from the mounting surface 14 to a peak 50. The distance between the light emitting diode 28 and the light shield 40 and the predetermined angle of the light shield 40 may be varied from light shield 40 to light shield 40 for directing light in various directions and angles.

In the embodiment of FIGS. 1 and 4, the light shields 40 include a pair of sections 44 each defined by a triangular shape. The pair of sections 44 join at the ridge 48 extending upwardly from the mounting surface 14 to the peak 50 so that the forward facing opening comprises a triangular shape. One of the light shields 40 is be disposed adjacent each of the light emitting diodes 28, as shown in FIG. 1

In the embodiment of FIG. 3, each of the light shields 40 comprises three of the sections 44. One of the three sections 44 is a central section 44, disposed centrally and along and parallel to one of the rows of light emitting diodes 28. A pair of the sections 44 are disposed at section ends of the one central section 44 and join the one central section 44 at the ridge 48 extending upwardly from the mounting surface 14 to the peak 50 so that the forward facing opening comprises a rectangular shape.

Each of the sections 44 of the light shields 40 include an exterior surface, typically facing away from the mounting surface 14. Each of the sections 44 include and an interior surface, opposite the exterior surface, for reflecting the light from the at least one light emitting diode 28 disposed there under out of the forward facing opening in the predetermined direction. The light shields 40 are typically serially aligned along the mounting surface 14 in the predetermined direction to accumulate light so that the exterior surface of one light shield 40 is exposed to light emitting from an adjacent rearwardly spaced light shield 40. For example, in the embodiment of FIG. 3 wherein the heat sink 12 comprises a generally triangular shape, the exterior surface of each of the light shields 40 face toward the wide bottom end of the mounting surface 14 to accumulate light in the predetermined direction.

The exterior surface is inherently non-reflective or by way of a non-reflective film 52 or coating disposed over the exterior surface of each light shield 40 and is exposed to light emitting from the adjacent rearwardly spaced light shield 40 for absorbing light emitting from the adjacent rearwardly spaced light shield 40, as shown in FIG. 5. The non-reflective film 52 prevents light from reflecting off the exterior surface of the light shields 40, i.e., prevents undesired scattered light. The non-reflective film 52 typically comprises a flat black color painted onto the exterior surface.

The light shields 40 typically have an interior surface which is inherently reflective or by way of a specular or reflective material 54 disposed over the interior surface for reflecting light emitting from the light emitting diodes 28 disposed there under in the predetermined direction. The reflective material 54 is disposed over the interior surface, as shown in FIG. 5. By including a reflective interior surface, light that might otherwise be absorbed and lost to the light shield 40 can be redirected in the predetermined direction. The interior surface with the reflective material 54, combined with the non-reflective film 52 disposed over the exterior surface, gives rise to 20% more useful light, compared to L.E.D. light assemblies 10 without such an arrangement.

Obviously, many modifications and variations of the present invention are possible in light of the above teachings and may be practiced otherwise than as specifically described while within the scope of the appended claims. These antecedent recitations should be interpreted to cover any combination in which the inventive novelty exercises its utility. The use of the word "said" in the apparatus claims refers to an antecedent that is a positive recitation meant to be included in the coverage of the claims whereas the word "the" precedes a word not meant to be included in the coverage of the claims. In addition, the reference numerals in the claims are merely for convenience and are not to be read in any way as limiting.

What is claimed is:

1. A light emitting assembly (10) comprising;

a mounting surface (14), a plurality of light emitting diodes (28) disposed on said mounting surface (14), a plurality of light shields (40) supported by said mounting surface (14) and disposed over said light emitting diodes (28) for directing light emitting from said light emitting diodes (28) in a predetermined direction, said light shields (40) having an exterior surface, said light shields (40) being serially aligned along said mounting surface (14) in said predetermined direction with said exterior surface of one light shield (40) being exposed to light emitting from an adjacent light shield (40), and characterized by;

said exterior surface of said light shields (40) exposed to light emitting from said adjacent light shield (40) being non-reflective for absorbing light emitting from said adjacent light shield (40).

2. A light emitting assembly (10) as set forth in claim 1 wherein each of said light shields (40) has an interior surface being reflective for reflecting light from said at least one light emitting diode (28) disposed there under in said predetermined direction.

3. A light emitting assembly (10) as set forth in claim 2 further characterized by a non-reflective film (52) disposed over said exterior surface of said light shields (40) and a reflective material (54) disposed over said interior surface of said light shields (40).

4. A light emitting assembly (10) as set forth in claim 1 wherein each of said light shields (40) extends upwardly at a predetermine angle from said mounting surface (14) over at least one said light emitting diodes (28) to a forward edge (46) defining a forward facing opening for directing light out of said forward facing opening in said predetermined direction.

5. A light emitting assembly (10) as set forth in claim 1 wherein said light shields (40) comprise a thermally stable opaque material.

6. A light emitting assembly (10) as set forth in claim 1 wherein one of said light shields (40) is disposed over each of said light emitting diodes (28).

7. A light emitting assembly (10) as set forth in claim 6 further characterized by each of said light shields (40) including a pair of sections (44) being defined by a triangular shape and joining one another at a ridge (48) extending upwardly from said mounting surface (14) to a peak (50) to define a forward facing opening comprising a triangular shape.

8. A light emitting assembly (10) as set forth in claim 1 wherein said light emitting diodes (28) are aligned in rows being spaced and parallel to one another and further characterized by each of said light shields (40) comprising three sections (44) wherein one of said sections (44) is a central section (44) disposed along and parallel to one of said rows and extending upwardly from said mounting surface (14) to a forward edge (46) and a pair of said sections (44) are disposed at section ends of said one central section (44) and joining said one central section (44) at a ridge (48) extending from said mounting surface (14) to a peak (50) to define a forward facing opening of rectangular shape for emitting light from said light emitting diodes (28).

9. A light emitting assembly (10) as set forth in claim 8 further characterized by said mounting surface (14) being defined by a triangular shape so that said rows of said light emitting diodes (28) decrease in length from a wide top end (20) of said mounting surface (14) to a narrow bottom end (22) of said mounting surface (14) and said forward facing openings of said sections (44) facing toward said narrow bottom end (22) of said mounting surface (14).

10. A light emitting assembly (10) as set forth in claim 1 further comprising:

an insulation coating (30) of electrically insulating material disposed over said mounting surface (14), said light emitting diodes (28) being disposed in spaces between adjacent traces (32) a plurality of circuit traces (32) spaced from one another on said coating for preventing electrical conduction between said traces (32) so that said insulation coating (30) prevents electrical conduction from each of said traces (32) to said mounting surface (14), a plurality of light emitting diodes (28) disposed in spaces between adjacent ones of said traces (32) for emitting light, each of said light emitting diodes (28) having a positive lead (34) and a negative lead (36), said leads (34, 36) of each of said light emitting diodes (28) being in electrical engagement with said adjacent ones of said traces (32) for electrically interconnecting said traces (32) and said light emitting diodes (28), a conformal coating (38) of electrically insulating material disposed over said mounting surface (14) and said light emitting diodes (28) for environmental protection, and said light emitting diodes (28) being electrically interconnected in series with one another.

11. A light emitting assembly (10) as set forth in claim 1 further comprising a heat sink (12) of thermally conductive aluminum material presenting said mounting surface (14) and including a heat transfer surface (16) facing in the opposite direction from said mounting surface (14).

12. A light emitting assembly (10) as set forth in claim 11 wherein:

said heat sink (12) comprises a plurality of elongated strips, each of said elongated strips is disposed in spaced and parallel relationship to one another to present side edges defining an elongated slot (18) therebetween extending continuously along adjacent side edges of said elongated strips to separate and render adjacent elongated strips and said light emitting diodes (28) on said mounting surface (14) thereof independent of one another, said heat sink (12) includes a plurality of fins (24) extending transversely from said heat transfer surface (16) and disposed in spaced and parallel relationship to one another for transferring heat away from said heat sink (12) to surrounding ambient air, said fins (24) extend continuously between said strip ends of each of said elongated strips to present a void space (26) between adjacent fins (24) and open at said strip ends for exposing said void space (26) between said adjacent fins (24) to air, and said light emitting diodes (28) on each of said elongated strips being electrically interconnected in parallel with said light emitting diodes (28) on other elongated strips.

13. A light emitting assembly (10) comprising:

a heat sink (12) of thermally conductive aluminum material presenting a mounting surface (14) and a heat transfer surface (16) facing in the opposite direction from said mounting surface (14), an insulation coating (30) of electrically insulating material disposed over said mounting surface (14) of said heat sink (12), said insulation coating (30) being about fifty microns in thickness, a plurality of circuit traces (32) spaced from one another on said insulation coating (30) for preventing electrical conduction between said traces (32) so that said insulation coating (30) prevents electrical conduction from each of said traces (32) to said heat sink (12), a plurality of light emitting diodes (28) disposed in spaces between adjacent ones of said traces (32) for emitting light, each of said light emitting diodes (28) having a positive lead (34) and a negative lead (36), said leads (34, 36) of each of said light emitting diodes (28) being in electrical engagement with said adjacent ones of said traces (32) for electrically interconnecting said traces (32) and said light emitting diodes (28), a conformal coating (38) of electrically insulating material disposed over said mounting surface (14) and circuit traces (32) and said light emitting diodes (28) and said leads (34, 36) for protecting said light emitting diodes (28) and the accompanying electrical components, said conformal coating (38) comprising a transparent material and being about fifty microns in thickness, said light emitting diodes (28) being electrically interconnected in series with one another, a plurality of light shields (40) of a thermally stable opaque material disposed on said conformal coating (38) of said mounting surface (14) adjacent said light emitting diodes (28) for directing light emitting from said light emitting diodes (28) in a predetermined direction, each of said light shields (40) disposed over at least one of said light emitting diodes (28) and defined by sections (44) extending upwardly at a predetermined angle from said mounting surface (14) over said light emitting diode (28) to a forward edge (46) defining a forward facing opening for directing the light out of said forward facing opening in said predetermined direction, each of said sections (44) having an interior surface comprising a reflective material (54) for reflecting the light from said at least one light emitting diode (28) disposed there under out of said forward facing opening in said predetermined direction, each of said sections (44) having an exterior surface facing away from said mounting surface (14), said light shields (40) being serially aligned along said mounting surface (14) in said predetermined direction with said exterior surface of one light shield (40) being exposed to light emitting from said forward facing opening of an adjacent light shield (40), a light shield adhesive (42) of ultraviolet cured cyanoacrylate material securing said light shields (40) to said coating disposed over said mounting surface (14), characterized by;

a non-reflective film (52) defined by a flat black color disposed over said exterior surface of said sections (44) exposed to light emitting from said adjacent light shield (40) for absorbing light emitting from said forward facing opening of said adjacent light shield (40).

14. A light emitting assembly (10) as set forth in claim 13 further characterized by;

one of said light shields (40) being disposed adjacent each of said light emitting diodes (28), each of said light shields (40) including a pair of said sections (44), each of said sections (44) being defined by a triangular shape, and said triangular sections (44) joining at a ridge (48) extending upwardly from said mounting surface (14) to a peak (50) so that said forward facing opening is further defined by a triangular shape.

15. A light emitting assembly (10) as set forth in claim 14 wherein said heat sink (12) is defined by a plurality of elongated strips, each of said elongated strips is disposed in spaced and parallel relationship to one another to present side edges defining an elongated slot (18) therebetween extending continuously along adjacent side edges of said elongated strips to separate and render adjacent elongated strips and said light emitting diodes (28) on said mounting surface (14) thereof independent of one another, said heat sink (12) includes a plurality of fins (24) extending transversely from said heat transfer surface (16) and disposed in spaced and parallel relationship to one another for transferring heat away from said heat sink (12) to surrounding ambient air, said fins (24) extend continuously between said strip ends of each of said elongated strips to present a void space (26) between adjacent fins (24) and open at said strip ends for exposing said void space (26) between said adjacent fins (24) to air, and said light emitting diodes (28) on each of said elongated strips being electrically interconnected in parallel with said light emitting diodes (28) on other elongated strips.

16. An assembly (10) as set forth in claim 15 wherein said heat transfer surface (16) on each of said elongated strips is disposed at an angle other than ninety degrees relative to said parallel fins (24) thereof.

17. A light emitting assembly (10) as set forth in claim 13 further characterized by;

said light emitting diodes (28) being aligned in rows, said rows being spaced and parallel to one another, each of said light shields (40) including three of said sections (44), one of said sections (44) being a central section (44) disposed centrally and along and parallel to one of said rows and extending upwardly from said mounting surface (14) to a forward edge (46), and a pair of said sections (44) being disposed at section ends of said one central section (44) and each joining said one central section (44) at a ridge (48) extending upwardly from said mounting surface (14) to a peak (50) to define a forward facing opening of rectangular shape for emitting said reflected light.

18. An assembly (10) as set forth in claim 17 further characterized by;

said mounting surface (14) of said heat sink (12) being defined by a triangular shape so that said rows of said light emitting diodes (28) decrease in length from a wide top end (20) of said mounting surface (14) of said heat sink (12) to a narrow bottom end (22) of said mounting surface (14), a plurality of fins (24) extending transversely from said heat transfer surface (16) and disposed in spaced and parallel relationship to one another for transferring heat away from said heat sink (12) to surrounding ambient air, said fins (24) extend continuously between said wide top end (20) and said narrow bottom end (22) of said mounting surface (14) of said heat sink (12) to present a void space (26) between adjacent fins (24) and open at said wide top end (20) and said narrow bottom end (22) for exposing said void space (26) between said adjacent fins (24) to air, and said interior surface and said forward facing opening of said sections (44) light shields (40) facing toward said narrow bottom end (22) of said heat sink (12).

* * * * *

UNITED STATES PATENT AND TRADEMARK OFFICE

CERTIFICATE OF CORRECTION

PATENT NO. : 8,669,570 B2
APPLICATION NO. : 13/057531
DATED : March 11, 2014
INVENTOR(S) : Peter A. Hochstein It is certified that error appears in the above-identified patent and that said Letters Patent is hereby corrected as shown below:

In the Specification:

| Column | Line | |
|---|---|---|
| 3 | 21 | "alight" should read "a light" |
| 3 | 33 | "alone" should read "along" |

Signed and Sealed this
Twentieth Day of May, 2014

Michelle K. Lee

Michelle K. Lee
*Deputy Director of the United States Patent and Trademark Office*